United States Patent

Banba

[11] Patent Number: 6,031,397
[45] Date of Patent: Feb. 29, 2000

[54] NEGATIVE VOLTAGE DETECTION CIRCUIT OFFSETTING FLUCTUATION OF DETECTION LEVEL

[75] Inventor: Hironori Banba, Kamakura, Japan

[73] Assignee: Kabushiki Kaisha Toshiba, Kawasaki, Japan

[21] Appl. No.: 09/028,275

[22] Filed: Feb. 24, 1998

[30] Foreign Application Priority Data

Feb. 26, 1997 [JP] Japan ................................. 9-042243

[51] Int. Cl.[7] .................................................. H03K 5/153
[52] U.S. Cl. ................................................. 327/81; 327/80
[58] Field of Search ................................. 327/77, 78, 80, 327/81, 534, 535, 536, 537; 323/315

[56] References Cited

U.S. PATENT DOCUMENTS

| | | | |
|---|---|---|---|
| 4,709,172 | 11/1987 | Williams | 327/437 |
| 5,208,488 | 5/1993 | Takiba et al. | 327/77 |
| 5,220,221 | 6/1993 | Casper | 327/51 |
| 5,666,076 | 9/1997 | Fugere et al. | 327/77 |
| 5,708,420 | 1/1998 | Drouot | 327/535 |
| 5,744,998 | 4/1998 | Ito et al. | 327/537 |

OTHER PUBLICATIONS

Basic Integrated Circuit Building Blocks, VLSI Design Techniques For Analog And Digital Circuits, pp. 366–377.

*Primary Examiner*—Toan Tran
*Attorney, Agent, or Firm*—Banner & Witcoff, Ltd.

[57] ABSTRACT

A negative voltage detection circuit has a detection level of which is independent from the threshold voltage of a MOS transistor incorporated into the memory device. The negative voltage detection circuit detects whether or not the output voltage of a charge pump has a desired level, and then a signal is output in accordance with the detection result. The negative voltage detection circuit detects the negative voltage by comparing the multiple of the negative voltage by $-(1/n)$ (n is a natural number) with a the positive inner reference voltage $V_{ref}$. When the multiple and the reference voltage $V_{ref}$ are equal to each other, the negative voltage detection circuit determines that the negative voltage has the desired level. When the level of the output is lower than the desired level, the charge pump is stopped. Otherwise, a control signal is output to operate the charge pump so as to control the negative voltage at the desired level by the feed back control.

19 Claims, 7 Drawing Sheets

NEGATIVE VOLTAGE DETECTION CIRCUIT OFFSETTING FLUCTUATION OF DETECTION LEVEL

BACKGROUND OF THE INVENTION

This invention relates to a negative voltage detection circuit for generating a control signal which controls the level of a negative voltage generated in a chip by a charge pump or the like, or to a non-volatile semiconductor memory device incorporating the negative voltage detection circuit.

In a flash memory device in which programmed data is erased by applying a negative voltage to a gate thereof, a charge pump (a charge pump circuit) generates the erasing negative voltage within a range from −5 to −11 V in a chip. The negative voltage must be controlled with high precision in the erasing rate, the withstand voltage of the element, and the reliability in erasing.

Figure 1:
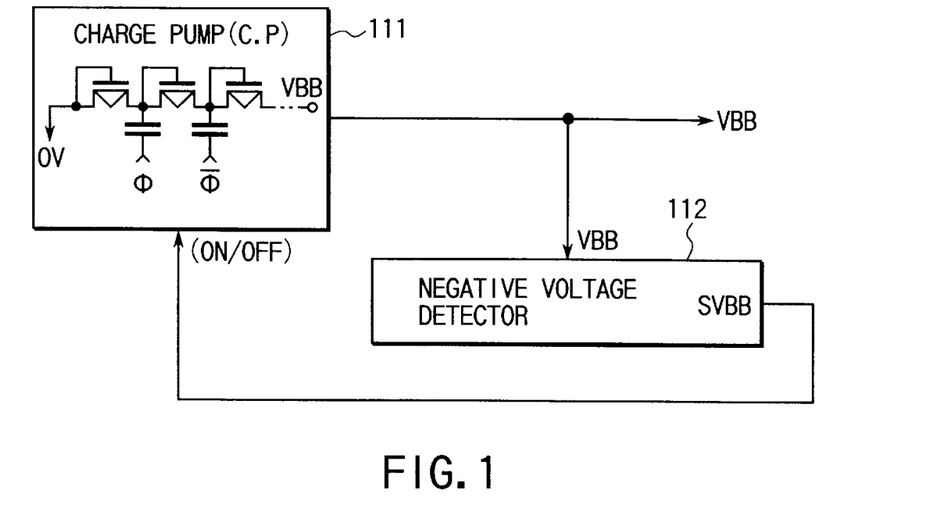
FIG. 1 is a general circuit diagram showing the relationship between a charge pump and a negative voltage detection circuit.

FIG. 1 is a circuit diagram showing the general relationship between the charge pump and a negative voltage detection circuit. A negative voltage detection circuit 112 detects whether or not a negative voltage VBB as an output of a charge pump (C.P) 111 has a desired level, and then outputs a signal SVBB in accordance with the detection result: when the level of the negative voltage VBB is lower than the desired level, the control signal SVBB is generated to stop the charge pump, and in the other case, to operate the charge pump 1. As is clear from this, the circuit shown in FIG. 1 executes the feedback control of the charge pump 111 to set the negative voltage VBB output from the charge pump 111 at a desired level, thereby obtaining the desired level of the erasing negative voltage.

Figure 2:
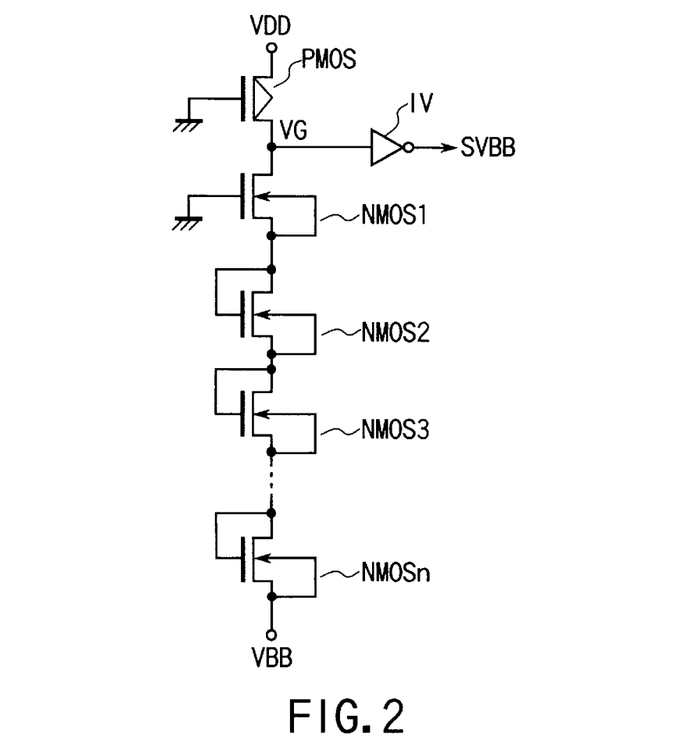
FIG. 2 is a circuit diagram showing the conventional negative voltage detection circuit.

FIG. 2 is a circuit diagram showing the conventional negative voltage detection circuit such as shown in FIG. 1 by the reference numeral 112. In this conventional negative voltage detection circuit, a P-channel MOS transistor (PMOS) the gate of which is connected to ground has a current path located between a power source voltage VDD and an input node VG of an inverter IV. Between the node VG and a negative voltage source VBB, a plurality of N-channel MOS transistors (NMOS 1-n) are arranged to connect the current paths in series. Among the N-channel MOS transistors, a transistor NMOS 1 has a source connected to the node VG which is applied with a ground potential, and the other transistors NMOSs 2-n each has a gate connected to its own source.

The potential at the node VG in the circuit shown in FIG. 2 can be represented by the following formulas using the threshold voltage $V_{th}$ of the N-channel MOS transistors and the number of the transistors:

$$VG=VBB+(n-1)\times V_{th}(\text{when } VBB+n\times V_{th}<VDD) \quad (2)$$

$$VG=VDD(\text{when } VBB+n\times V_{th}\geq VDD) \quad (3)$$

The transistor NMOS 1 shown in FIG. 1 is turned ON when the negative voltage VBB increases (the level of the negative voltage becomes higher). When the transistor NMOS 1 is turned ON, the potential VDD is dropped at the node VG to exceed the threshold voltage of the inverter IV, and the level of the signal SVBB is inverted from low to high. In short, the formula (2) is satisfied in the region where the negative voltage VBB has a value to invert the signal SVBB. In other words, when the potential of the source of the transistor NMOS 1 is lower than $-V_{th}$ (the threshold voltage of the transistor NMOS 1), the transistor NMOS 1 is turned on, and the potential of the node VG is rapidly dropped.

The above-mentioned relationship, however, can be attained only by using the threshold voltage $V_{th}$ of a general MOS transistor, and may be affected by the variations in the manufacturing process or by the temperature dependency of the MOS transistor. The switching level of the transistor NMOS 1, i.e., the detection level of the negative voltage VBB is fluctuated by the influence of these factors. In addition, the detection level can be changed only by changing the number of the transistors, and thus detection with high precision cannot be attained.

BRIEF SUMMARY OF THE INVENTION

The object of the present invention is to provide a negative voltage detection circuit having a detection level which is not affected by the threshold voltage of the MOS transistors constituting the detection circuit, thereby to improve the reliability of the non-volatile semiconductor device containing the detection circuit therein.

The object of the present invention can be attained by the circuit as described below:

The negative voltage detection circuit of the present invention is characterized in that the negative voltage is detected to have a desired level when the multiple of the negative voltage by −(1/n) substantially equals to to a positive reference voltage, where n is a natural number.

The negative voltage detection circuit includes a current mirror circuit, and generates a level at an output node of the current mirror circuit corresponding to whether the reference voltage is larger or smaller than the −(1/n) multiple of the negative voltage.

The present invention is further characterized in that a non-volatile semiconductor memory device which comprises a plurality of non-volatile memory cells and a negative charge pump circuit for generating a negative voltage necessary for erasing data from the memory, and a reference voltage generating circuit for generating an arbitrary positive reference voltage, and a detection circuit for detecting that the negative voltage has a desired level when a multiple of the negative voltage by −(1/n) substantially equals to a potential corresponding to the reference voltage.

According to the constitution of the present invention, the current mirror circuit detects the level of the voltage by comparing the negative voltage with the reference voltage, thereby the detection level will not be affected by the power source voltage and the threshold voltage of the MOS transistors in the current mirror circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 3:
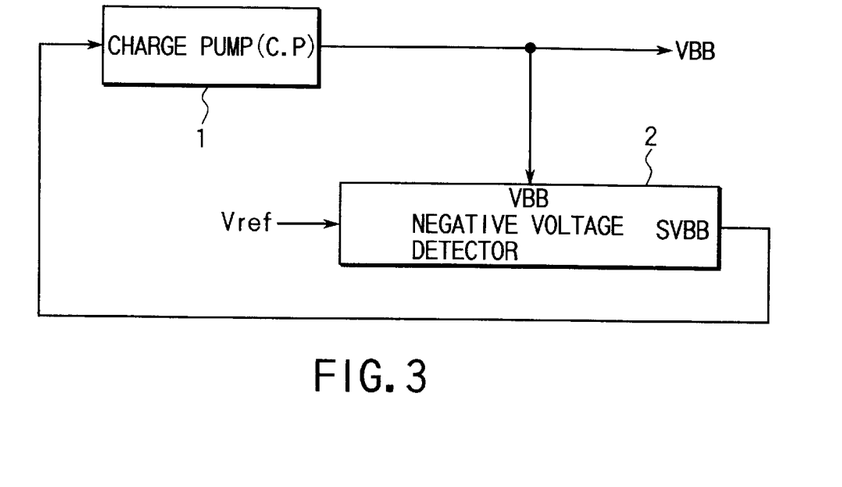
FIG. 3 is a circuit diagram showing the first embodiment of the present invention, wherein a negative voltage detection circuit according to the present invention is illustrated to be related to a charge pump.

FIG. 3 is a circuit diagram showing the first embodiment of the present invention, wherein a negative voltage detection circuit according to the present invention is illustrated to be related to a charge pump. A negative voltage detection circuit 2 detects a negative voltage by determining whether or not the negative voltage VBB as an output of a charge pump (C.P) 1 has a desired level, and then outputs a signal SVBB in accordance with the determination. In the determination, the negative voltage detection circuit 2 of the present invention determines whether or not the multiple of the negative voltage by −(1/n) equals a positive inner reference voltage, where n is a natural number. The signal SVBB is a control signal. When the output voltage VBB is lower than the desired value, the signal SVBB is generated to stop the operation of the charge pump 1. In the other case, the signal SVBB is output to operate the charge pump 1. In this manner, the circuit shown in FIG. 3 performs the feedback control by comparing the output voltage VBB of the charge pump 1 with the reference voltage $V_{ref}$ thereby controlling the output voltage VBB of the charge pump 1 to be set at the desired level.

Figure 4:
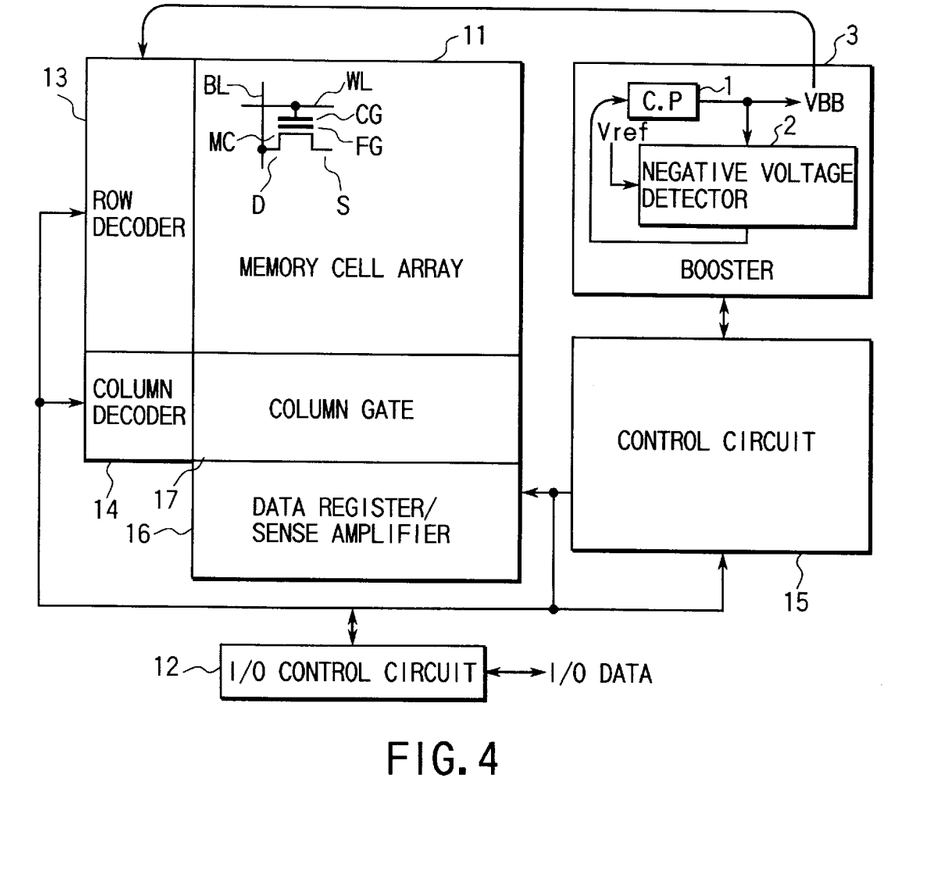
FIG. 4 is a circuit diagram showing the second embodiment of the present invention, wherein a memory device into which a negative voltage detection circuit according to the present invention is incorporated is illustrated.

FIG. 4 is a circuit diagram showing the second embodiment of the present invention, wherein a memory device into which a negative voltage detection circuit according to the present invention is incorporated is illustrated. This memory device is a non-volatile semiconductor memory device such as a flash memory device in which programmed data is erased by applying a negative voltage to a gate thereof. The memory device includes a booster for boosting a negative voltage to be applied to the gate electrode of the non-volatile memory cell, and if necessary, comprises a booster (not shown) for boosting a positive voltage. Together with the charge pump (C.P) 1 as boosting means for boosting the negative voltage, the negative voltage detection circuit 2 is incorporated into a booster 3 for generating a negative voltage to be applied to the gate electrode of the non-volatile memory cell to erase the data stored in the memory.

FIG. 4 shows a memory cell array 11 in which a plurality of non-volatile memory cells (flash cells [hereinafter referred to as "MCs"]: only one of the MCs is illustrated in the drawing) are integrated in a matrix. The MCs comprise a plurality of bit lines BLs; word lines WLs (only one BL and WL are illustrated in the drawing); a floating gate FG; a control gate CG; a source S; and a drain D. By injecting electrons into the floating gate or discharging the electrons therefrom to change the threshold voltage of the control gate, the program/data stored in a memory cell is electrically erased. The control gate CG is connected to one of the word lines WLs. The sources Ss of the memory cells are connected to a common source line (not shown) in unit of a bit line, word line, or block.

An I/O control circuit 12 generates an inner address signal upon receiving an address signal from the outside, and supplies the inner address signal to a row decoder 13, a column decoder 14, and a control circuit 15. The I/O control circuit supplies the data input from the outside to a data register/sense amplifier 16 in writing data. In reading data, the data sensed by the data register/sense amplifier 16 is output to the outside. A controller 15 receives the inner address signal from the I/O control circuit 12 so as to control the memory cell array such that nodes of the memory cells have a predetermined relationship in potential in accordance with respective operations such as programming/erasing/reading.

The row decoder 13 selects some of the word lines WLs in the memory cell array 11 in accordance with the received inner address signal (inner row address signal). A column gate 17 selects some of the bit lines BLs in the memory cell array 11 in accordance with the output of the column decoder 14. In writing data, the data register/sense amplifier 16 sends data to be written to a selected one of the memory cells in the memory cell array 11. In reading data, the data register/sense amplifier 16 senses data to be read from the selected one of the memory cells in the memory cell array 11.

Figure 5:
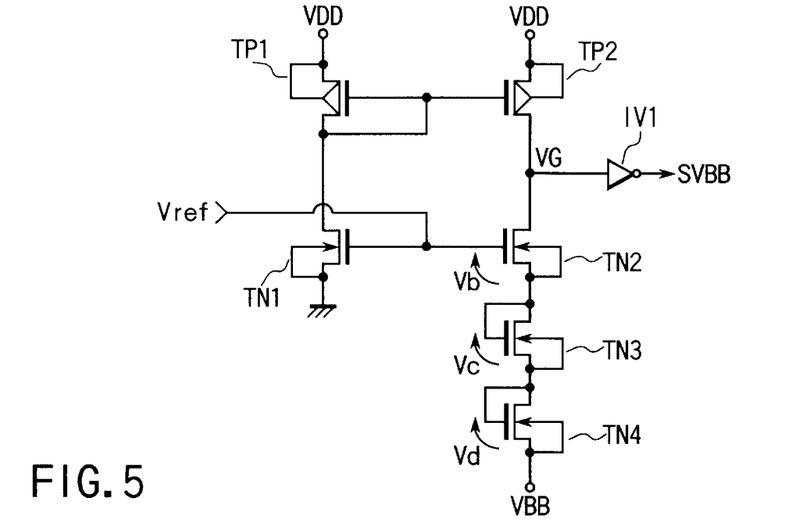
FIG. 5 is a circuit diagram showing the third embodiment of the present invention, wherein the first specific circuit realizing a negative voltage detection circuit according to the present invention is illustrated.

FIG. 5 is a circuit diagram showing the third embodiment of the present invention, wherein the first specific circuit realizing a negative voltage detection circuit according to the present invention is illustrated. P-channel MOS transistors TP1 and TP2 used in the circuit have the same size. Similarly, N-channel MOS transistors TN1–TN4 provided to the circuit have the same size. The common gate of TP1 and TP2 is connected to the drain of TP1 to constitute a current mirror circuit. TN1 has a current path between the drain of TP1 and the ground. TN2–TN4 have current paths connected in series between the drain of TP2 and the negative voltage VBB. The common gate of TN1 and TN2 is applied with an inner reference voltage $V_{ref}$. Each of TN3 and TN4 has a gate connected to their own drain of the transistor to constitute a diode. A common node VG common to TP2 and TN2 functions as an input terminal of an inverter IV1. The inverter IV1 receives the input signal and outputs a control signal SVBB.

When TN2–TN4 are used in a pentode region, the voltages between the gate and source of TN2–TN4 are set to satisfy the formula Vb=Vc=Vd. The voltage difference between the gate of TN2 and the voltage node VBB is expressed by the following equation:

$$Vref-VBB=Vb+Vc+Vd=3Vb. \quad (1)$$

When the gate-to-source voltage Vb of TN2 is smaller than the gate-to-source voltage of TN1 which equals the reference voltage $V_{ref}$, the current flowing in TN2 is less than the current flowing through TN1, and thus the potential at the node VG is set at a high level. On the other hand, when the voltage Vb at TN2 is greater than the gate-to-source voltage of TN1 which equals the reference voltage $V_{ref}$, that is, when Vb>Vref, the current flowing through TN2 is greater than the current flowing through TN1, with the result that the voltage at the node VG is set at a low level. In accordance with the voltage at the node VG, the IV1 outputs the SVBB signal as a logic signal for controlling the operation of the charge pump 1. In the embodiment, the minimum negative voltage that can turn the SVBB signal HIGH is determined in accordance with the number of MOS transistors connected to TN2. According to equation (1):

$$VBB=Vref3-Vb<0 (VBB \text{ is negative voltage}) \quad (2)$$

As mentioned above, the SVBB signal is turned HIGH when Vb<Vref. Thus, the condition "Vb=Vref" can be regarded as the lowest limit to change the level to signal SVBB. Applying Vb=Vref to equation (2), VBB=2Vref is obtained. When VBB exceeds −2Vref even slightly, the SVBB signal is turned HIGH. This means that the detection level of the detection circuit is −2Vref. Similarly, in the case that n number of MOS transistors are connected to MOS transistors TN2, the detection level shall be −nVref.

The detection level of the above-mentioned circuit is $-2 \cdot V_{ref}$: the multiple of $V_{ref}$ by the negative number of the transistors which are connected in series to the transistor connected to the common node as an input terminal of the inverter. Accordingly, when the number of the transistors connected in series to the transistor connected to the input terminal of the inverter is n, the detection level is set at $-n \cdot V_{ref}$. In this manner, with use of the current mirror circuit constituted of the equivalent transistors (TP1 and TP2), the negative voltage detection circuit having the detection level which is determined only by the reference voltage and free from the influence of the power source voltage or the threshold voltage of the MOS transistors in the circuit is obtained.

Figure 10:
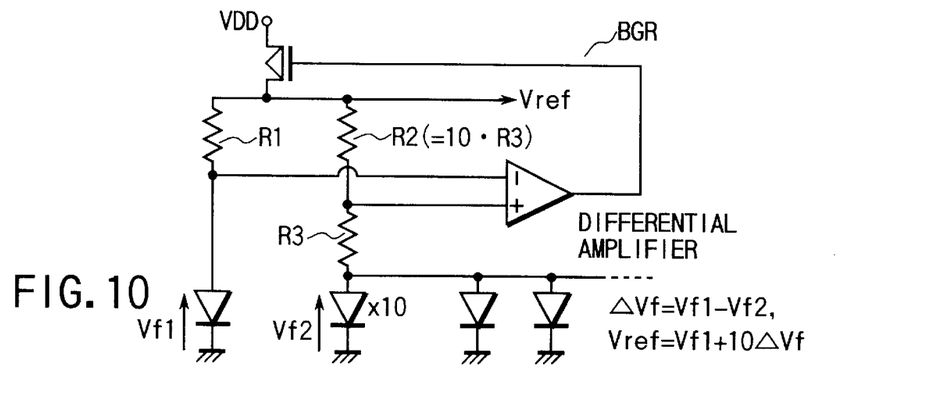
FIG. 10 is a circuit diagram showing a band gap reference circuit.

With such a constitution, the detection level can be easily changed by changing the value of the reference voltage. The reference voltage is preferably free from the fluctuation due to the change in the temperature or power source voltage. In particular, the reference voltage generated by a general band gap reference circuit BGR as shown in FIG. 10 has good characteristics.

Figure 6:
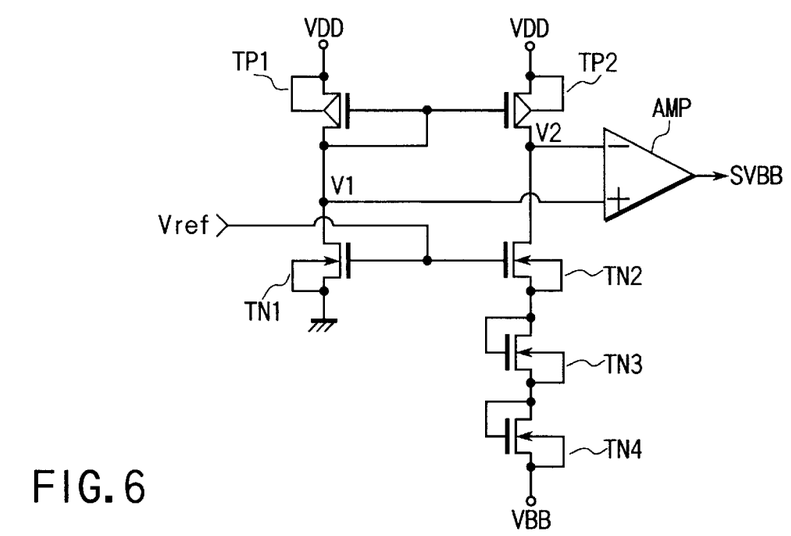
FIG. 6 is a circuit diagram showing the fourth embodiment of the present invention, wherein the second specific circuit realizing a negative voltage detection circuit according to the present invention is illustrated.
Figure 7:
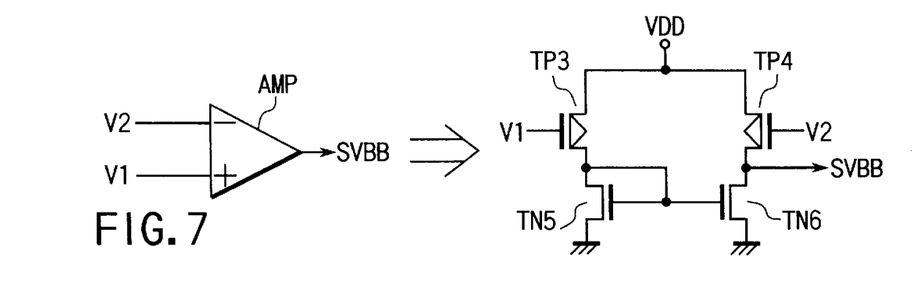
FIG. 7 is a circuit diagram showing the differential amplifier shown in FIG. 6.

FIG. 6 is a circuit diagram showing the fourth embodiment of the present invention, wherein the second specific circuit realizing a negative voltage detection circuit according to the present invention is illustrated. The circuit shown in this drawing can attain higher precision than the circuit shown in FIG. 5. In the circuit shown in FIG. 5, the signal output from the node VG is directly input to the inverter IV1. While, in the circuit shown in FIG. 6, the output of the node V1 and the output of the node V2 are input into a differential amplifier AMP to amplify the signal twice in order to improve the precision in detecting the voltage level of the negative voltage VBB. The other elements are the same as those of FIG. 5. FIG. 7 is a circuit diagram showing the circuit diagram of the differential amplifier shown in FIG. 6. In this drawing, TP3 and TP4 denote P-channel MOS transistors, and TN5 and TN6 denote N-channel MOS transistors.

Figure 8:
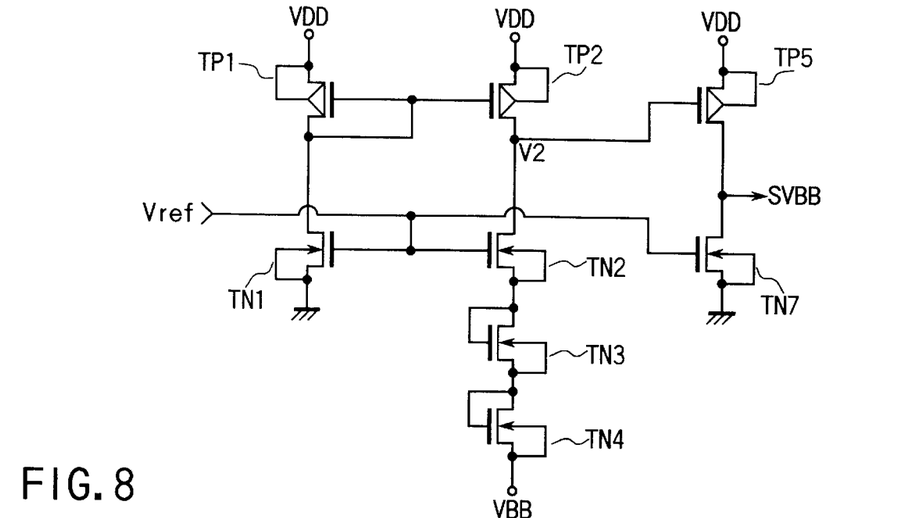
FIG. 8 is a circuit diagram showing the fifth embodiment of the present invention, wherein the third specific circuit realizing a negative voltage detection circuit according to the present invention is illustrated.

FIG. 8 is a circuit diagram showing the fifth embodiment of the present invention, wherein the third specific circuit realizing a negative voltage detection circuit according to the present invention is illustrated. The circuit shown in FIG. 8 has a smaller number of transistors in the differential amplifier AMP than that of FIG. 6 so as not to adversely affect the operation of the amplifier. In the differential amplifier of FIG. 8, the second amplifying cascade of the amplifier shown in FIG. 7 is omitted. In this circuit, a P-channel transistor TP5 having a gate applied with a potential of the node V2 and a N-channel transistor TN7 having a gate applied with the reference voltage $V_{ref}$ are connected in series between the power source voltage VDD and ground. The output signal SVBB is output from the common drain of the transistors TP5 and TN7.

Figure 9:
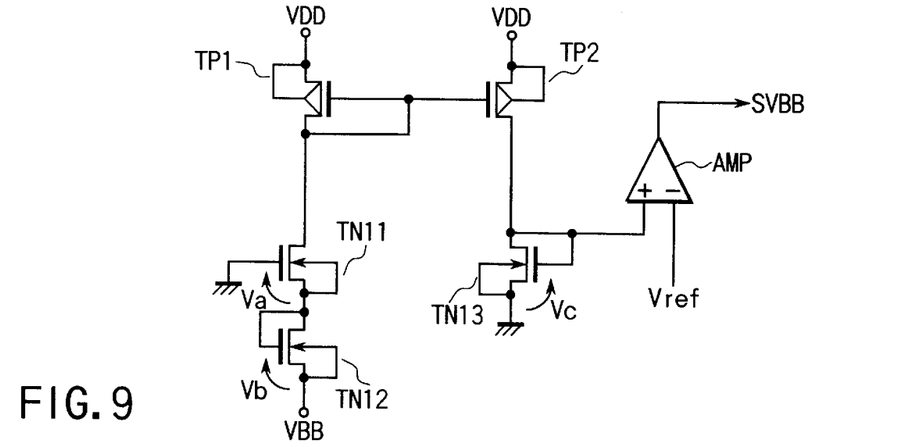
FIG. 9 is a circuit diagram showing the sixth embodiment of the present invention, wherein the fourth specific circuit realizing a negative voltage detection circuit according to the present invention is illustrated.

FIG. 9 is a circuit diagram showing the embodiment of the present invention, wherein the third specific circuit realizing a negative voltage detection circuit according to the present invention is illustrated. P-channel transistors TP1 and TP2 used in the circuit have the same size. Similarly, N-channel transistors TN11–TN13 provided to this circuit have the same size. The common gate common to TP1 and TP2 is connected to the drain of TP1 so as to constitute a current mirror circuit. Transistors TN11 and TN12 have current paths connected in series between the drain and the negative voltage VBB. TN11 has a gate connected to ground so as to be constantly turned on, and the gate of TN12 is connected to its own drain to constitute a diode. The transistor TN13 has a current path connected between the drain of the transistor TP2 and ground, and the gate and the drain connected to each other to be constantly turned on. The common drain of TP2 and TN13 is connected to a non-inversion input terminal of a differential amplifier AMP. The inversion input terminal is applied with an inner reference voltage $V_{ref}$. The differential amplifier AMP outputs a control signal SVBB. The inner reference voltage $V_{ref}$ in this embodiment can be also provided with good characteristics when the inner reference voltage $V_{ref}$ is generated by a band-gap reference circuit (see FIG. 10).

With the above-mentioned constitution, when the transistors TN11–TN13 are used in the pentode region, the voltages between the gates and sources of TN2–TN4 are set to satisfy the formula Va=Vb=Vc. In this time, the formula Vc=(-VBB)/2 is also satisfied. Accordingly, the level of the negative voltage can be detected as $-2 \cdot V_{ref}$ by comparing Vc with $V_{ref}$ by using the differential amplifier AMP. Where the number of the transistors connected in series to the transistor TN11 is n, the detection level is set at $-n \cdot V_{ref}$.

Figure 11:
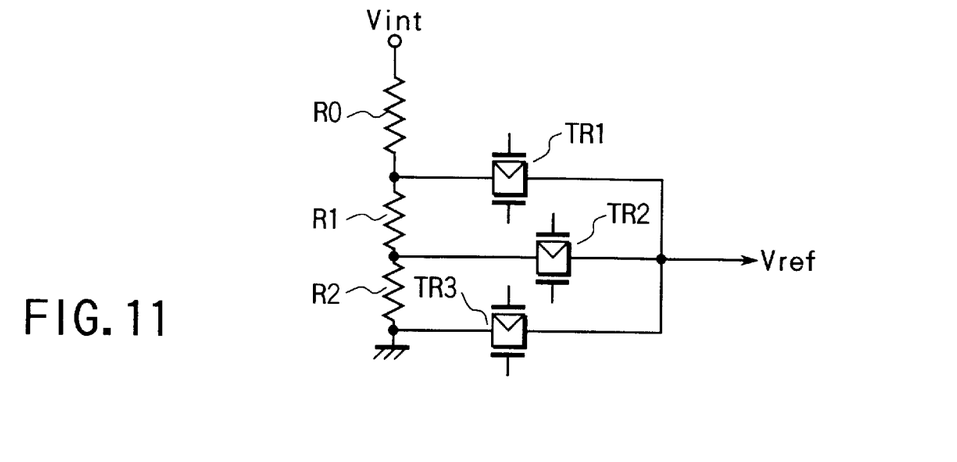
FIG. 11 is a circuit diagram showing the seventh embodiment of the present invention, wherein the circuit capable of varying the detection level of a negative voltage detection circuit according to the present invention is illustrated.

FIG. 11 is a circuit diagram showing the seventh embodiment of the present invention, wherein the circuit capable of varying the detection level of a negative voltage detection circuit according to the present invention is illustrated. As described in the above embodiments, the negative voltage detection of the present invention can be easily changed by changing the reference voltage $V_{ref}$. According to the present embodiment, the stabilized inner voltage $V_{int}$ is divided by the resistance to be used as the reference voltage $V_{ref}$. In this time, the divisional ratio by the resistance of the stabilized inner voltage $V_{int}$ is changed by switching transfer gates TR1–TR3 formed of P-channel transistor or N-channel transistor. The reference voltage $V_{ref}$ determined in this manner can be used in the circuits shown in FIGS. 5, 6, 8, and 9.

Figure 12:
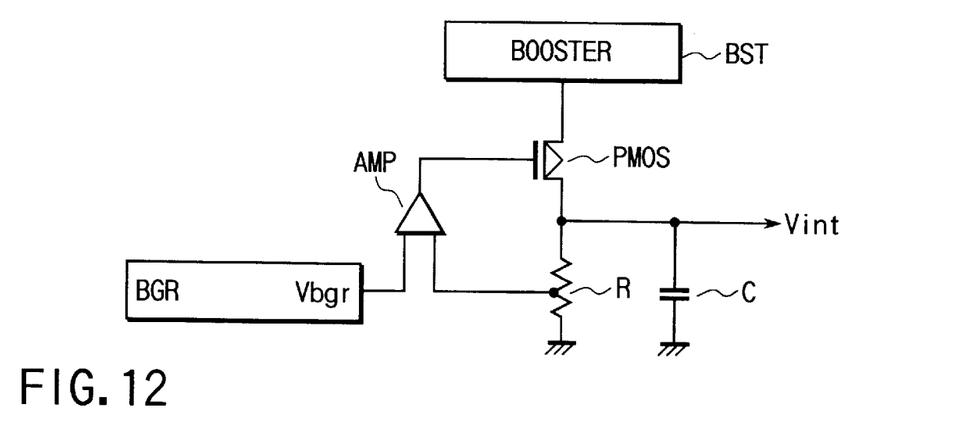
FIG. 12 is the first circuit diagram showing a circuit for generating a stable inner voltage $V_{int}$ according to the seventh embodiment shown in FIG. 11.
Figure 13:
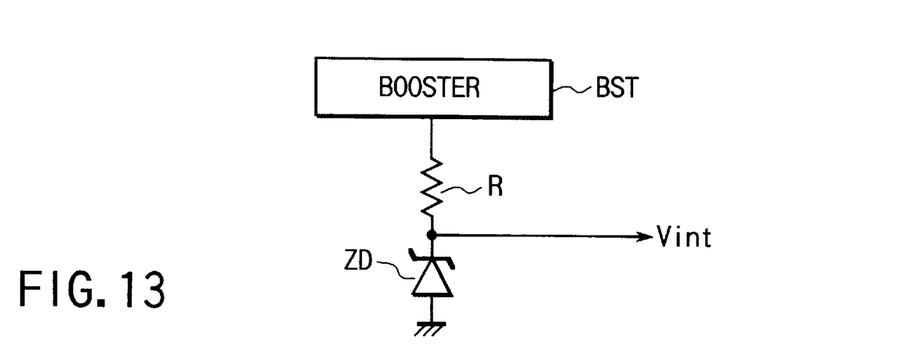
FIG. 13 is the second circuit diagram showing a circuit for generating the stable inner voltage $V_{int}$ in the constitution shown in FIG. 11.
Figure 14:
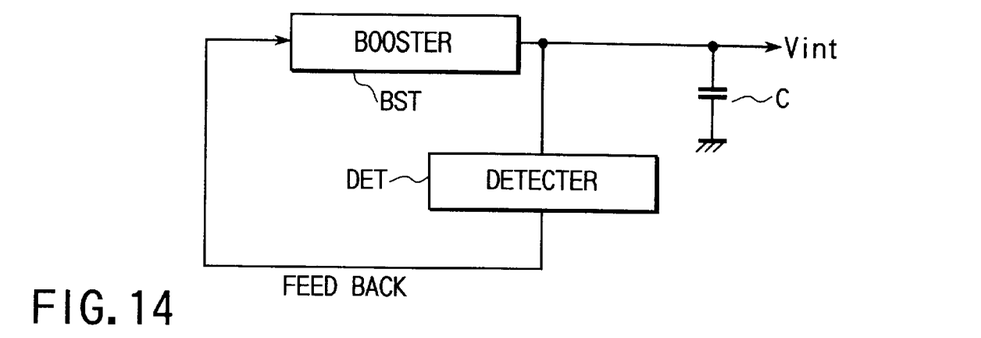
FIG. 14 is the third circuit diagram showing a circuit for generating the stable inner voltage $V_{int}$ the constitution shown in FIG. 11.

FIGS. 12, 13, and 14 respectively show the circuit for generating the stabilized inner voltage $V_{int}$ in the circuit shown in FIG. 11. In the circuit shown in FIG. 12, a voltage output from an inner booster BST is stabilized by controlling the P-channel MOS transistor and a resistance R, and monitored by comparing the voltage with $V_{bgr}$ generated by the band-gap reference circuit BGR, to obtain the stabilized inner voltage $V_{int}$. When the band-gap reference circuit BGR is designated to have no temperature-dependency characteristics, the output voltage of the band-gap reference circuit BGR is 1.3 V, for example, and cannot be changed. If the reference voltage $V_{ref}$ is obtained by applying the output voltage $V_{int}$ of the circuit shown in FIG. 12 to the circuit as shown in FIG. 11, the reference voltage $V_{ref}$ can be changed, and the variable detection level can be attained.

FIG. 13 is the circuit diagram showing a circuit for generating the stabilized inner voltage $V_{int}$, wherein a zener diode ZD is used as a constant voltage output element and the output from ZD passes through a resistance R to stabilize the voltage. FIG. 14 is the circuit diagram showing a circuit to constitute the same feedback system as shown in FIG. 1 for generating the stabilized inner voltage $V_{int}$.

With use of the constitutions shown in FIGS. 13 and 14, the negative voltage detection level independent from the power source voltage VDD can be attained. As described above, if the voltage of the external power source is more reduced the operation margin for the circuit is lost, the inner boosting voltage can be used as the power source voltage, instead of the external power source voltage.

Figure 15:
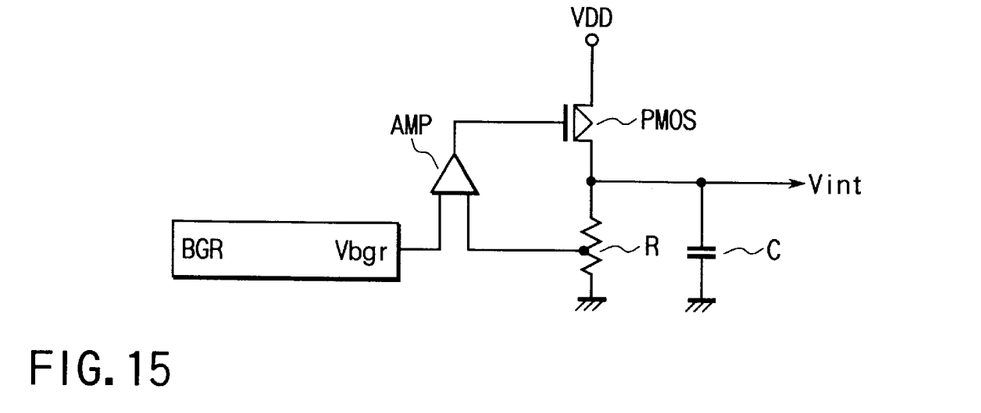
FIG. 15 is the circuit diagram showing an alternative embodiment of the circuit shown in FIG. 12.
Figure 16:
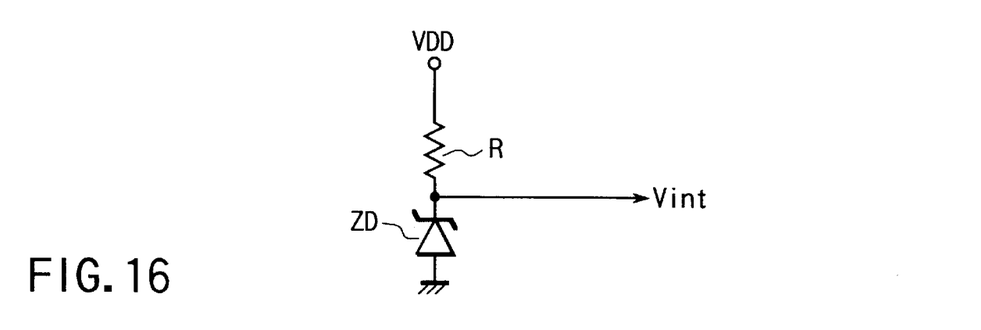
FIG. 16 is the circuit diagram showing an alternative embodiment of the circuit shown in FIG. 13.

In the circuits shown in FIGS. 15 and 16, a booster provided to the constitution shown in FIGS. 12 and 13 is omitted, and the external power source voltage is used as a power source voltage without boosting the external power source voltage, unlike the circuits shown in FIGS. 12 and 13. The circuits shown in FIGS. 15 and 16 can be used when the power source voltage VDD is not low and needs not to be boosted as shown in FIGS. 15 and 16. In other words, the circuits shown in FIGS. 15 and 16 can be used in the case where the sufficient circuit margin can be obtained without boosting the power source voltage VDD.

Figure 17:
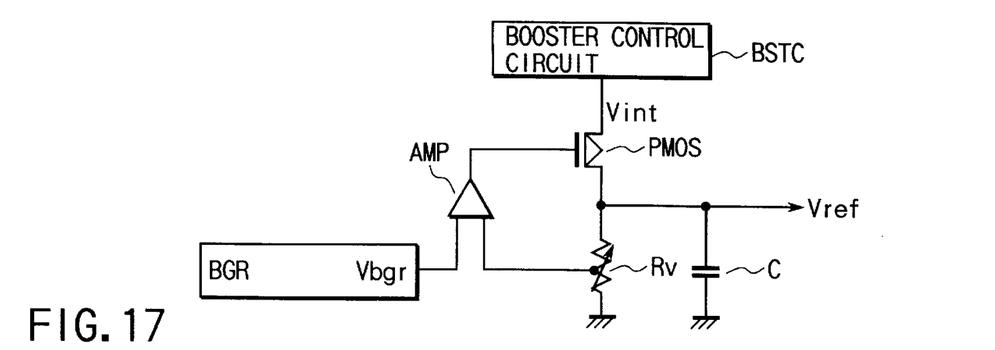
FIG. 17 is a circuit diagram showing the eighth embodiment of the present invention, wherein the circuit capable of varying the detection level of a negative voltage detection circuit according to the present invention is illustrated.

FIG. 17 is a circuit diagram showing the eighth embodiment of the present invention, wherein the circuit capable of varying the detection level of a negative voltage detection circuit according to the present invention is illustrated. As described in the above embodiment, the negative voltage detection circuit according to the present invention can be easily changed by changing the reference voltage $V_{ref}$. In the circuit of FIG. 17, the voltage $V_{int}$ output from an inner booster control circuit BSTC is stabilized by switching the P-channel MOS transistor and controlling a variable resistance Rv, and monitored by being compared with $V_{bgr}$ generated by the band-gap reference circuit BGR, to obtain the reference voltage $V_{ref}$. The variable resistance Rv functions in the same manner as in the circuit shown in FIG. 11. With this constitution, the reference voltage $V_{ref}$ can be changed, and the variable detection level can be attained. The inner booster control circuit BSTC can be constituted of the circuit shown in FIG. 14, for example.

Figure 18:
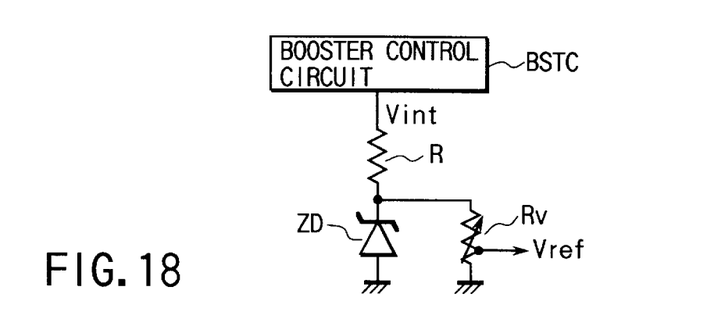
FIG. 18 is a circuit diagram showing the ninth embodiment of the present invention, wherein the circuit capable of varying the detection level of a negative voltage detection circuit according to the present invention is illustrated.

FIG. 18 is a circuit diagram showing the ninth embodiment of the present invention, wherein the circuit capable of varying the detection level of a negative voltage detection circuit according to the present invention is illustrated. As described in the above embodiment, the negative voltage detection circuit according to the present invention can be easily changed by changing the reference voltage $V_{ref}$. In the circuit of FIG. 18, a zener diode ZD is used as a constant voltage output element. A variable resistance Rv is connected with the zener diode ZD in parallel. The voltage $V_{int}$ output from the inner booster control circuit BSTC applied to the zener diode ZD through a resistance R is stabilized by the zener diode ZD. The stabilized $V_{int}$ is applied to the variable resistance Rv, then the reference voltage $V_{ref}$ is obtained. The variable resistance Rv functions in the same manner as in the circuit shown in FIG. 11. With use of this constitution, the reference voltage $V_{ref}$ can be changed, and the variable detection level can be attained. The inner booster control circuit BSTC can be constituted of the circuit shown in FIG. 14, for example.

Figure 19:
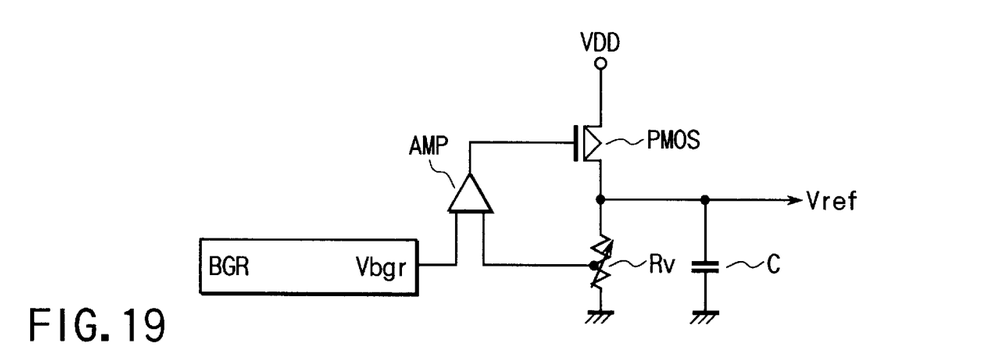
FIG. 19 is the circuit diagram showing an alternative embodiment of the circuit shown in FIG. 17.
Figure 20:
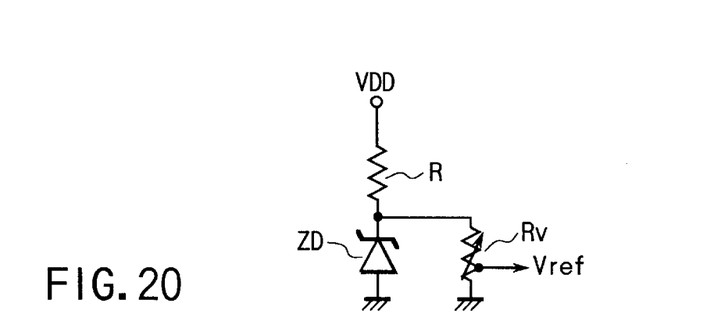
FIG. 20 is the circuit diagram showing an alternative embodiment of the circuit shown in FIG. 18.

In the circuits shown in FIGS. 19 and 20, a booster provided to the constitution shown in FIGS. 17 and 18 is omitted, and the external power source voltage is used as a power source voltage without boosting the external power source voltage, unlike the circuits shown in FIGS. 17 and 18. Accordingly, the circuits shown in FIGS. 19 and 20 can be used when the power source voltage VDD is not low and needs not to be boosted as shown in FIGS. 17 and 18. In other words, the circuits shown in FIGS. 19 and 20 can be used in the case where the sufficient circuit operation margin can be obtained without boosting the power source voltage VDD.

Consequently, according to the present invention, the negative voltage detection circuit offsets the fluctuation of the power source voltage, the threshold voltage of the transistor, or the dependency on temperature, by using a current mirror circuit. In addition, the present invention determines the negative voltage detection level is determined by the applied inner reference voltage and the number of the transistors which are related to the setting of the level of the negative voltage, and thus highly precise detection of the level of the negative voltage can be attained. According to the present invention, the negative voltage detection level can be easily changed not only by changing the number of the transistors, but also by making the inner reference voltage variable. The circuit of the present invention is thus advantageous in the case where a plurality of detection levels are required. With the present invention, therefore, the negative voltage used for the memory device or the like can be controlled with ease and high reliability. Particularly, the reliability of a non-volatile semiconductor memory device having a negative voltage detection circuit can be remarkably improved with use of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A negative voltage detection circuit comprising:
   a node to which an arbitrary positive reference voltage is applied;
   a detection circuit having a current mirror circuit, for detecting a level of a negative voltage applied when the negative voltage multiplied by $-(1/n)$ substantially equals a potential corresponding to the reference voltage of the node, said detection circuit generating a signal at an output node of the current mirror circuit depending on whether the reference voltage is larger or smaller than the negative voltage multiplied by $-(1/n)$, where n is a positive integer.

2. A negative voltage detection circuit according to claim 1, wherein the reference voltage is generated in a device into which the negative voltage detection circuit is incorporated.

3. A negative voltage detection circuit according to claim 1, wherein the reference voltage is applied from a band-gap reference circuit.

4. A negative voltage detection circuit according to claim 1, wherein the reference voltage is variable.

5. A negative voltage detection circuit according to claim 1, wherein the detection circuit is incorporated into a charge pump circuit for generating a negative voltage in a memory device into which data can be electrically written to and erased from.

6. A negative voltage detection circuit according to claim 1, wherein the level of the negative voltage is detected to control operation of a negative charge pump circuit for obtaining a desired negative potential.

7. A negative voltage detection circuit comprising;
   first and second MOS transistors, each having a gate applied with a reference voltage, a first terminal, and a second terminal;
   n MOS transistors, each n MOS transistor having a gate and a drain connected to operate as a diode, the n MOS transistors having a first terminal connected to the first terminal of the second MOS transistor, and a second terminal connected to a negative voltage source, where n is a positive integer, and wherein the second MOS transistor, the n MOS transistors and the negative voltage source are connected in series; and
   a current mirror circuit being connected to the second terminals of the first and second MOS transistors, for supplying a common power to the first and second MOS transistors,
   wherein the negative voltage supplied from the negative voltage source is detected via a drain voltage of the second MOS transistor.

8. A negative voltage detection circuit according to claim 7, further comprising a circuit for detecting the drain voltage of the second MOS transistor differentially by comparing it with a drain voltage of the first MOS transistor.

9. A negative voltage detection circuit according to claim 7, wherein the reference voltage is applied from a band-gap reference circuit.

10. A negative voltage detection circuit according to claim 7, wherein the reference voltage is variable.

11. A negative voltage detection circuit according to claim 7, wherein the detection circuit is incorporated into a charge pump circuit for generating a negative voltage in a memory device into which data can be electrically programmed to and erased from.

12. A negative voltage detection circuit according to claim 7, wherein a level of the negative voltage is detected to control operation of a negative charge pump circuit for obtaining a desired negative potential.

13. A negative voltage detection circuit comprising:
   a current mirror circuit for supplying power;
   first and second MOS transistors each having a first terminal connected to the current mirror circuit, a second terminal, and a gate being biased by an ON voltage;
   m MOS transistors, each having a drain and a gate connected to operate as a diode where m is a positive integer, and wherein the first MOS transistor, the m MOS transistors, and the negative voltage source are connected in series; and
   a differential amplifying circuit for comparing a drain voltage of the second MOS transistor with a reference voltage,
   wherein the voltage of the negative voltage source is detected via an output of the differential amplifying circuit.

14. A negative voltage detection circuit according to claim 13, wherein the reference voltage is applied from a band-gap reference circuit.

15. A negative voltage detection circuit according to claim 13, wherein the reference voltage is variable.

16. A negative voltage detection circuit according to claim 13, wherein the detection circuit is incorporated into a charge pump circuit for generating a negative voltage in a memory device into which data can be electrically programmed to and erased from.

17. A negative voltage detection circuit according to claim 13, wherein a level of the negative voltage is detected to control operation of a negative charge pump circuit for obtaining a desired negative potential.

18. A non-volatile semiconductor memory device comprising:
   a memory body having a non-volatile memory;
   a negative charge pump circuit for generating a negative voltage necessary for erasing data from the memory;
   a reference voltage generating circuit for generating an arbitrary positive reference voltage; and
   a detection circuit for detecting a level of the negative voltage when the negative voltage multiplied by $-(1/n)$ substantially equals a potential corresponding to the reference voltage, where n is a positive integer greater than 1.

19. A non-volatile semiconductor memory device according to claim 18, wherein the reference voltage is variable.

* * * * *